US007264915B2

(12) United States Patent
Song et al.

(10) Patent No.: US 7,264,915 B2
(45) Date of Patent: Sep. 4, 2007

(54) MANUFACTURING METHOD FOR DONOR FILM WITH IMPROVED SURFACE ROUGHNESS

(75) Inventors: Myung Won Song, Seoul (KR); Tae Min Kang, Yongin (KR); Sam Il Kho, Yongin (KR); Young Gil Kwon, Yongin (KR); Mu Hyun Kim, Yongin (KR); Sun Hoe Kim, Jeongeup (KR); Sok Won Noh, Seoul (KR); Yeun Joo Sung, Yongin (KR); Jin Wook Seong, Seoul (KR); Nam Choul Yang, Yongin (KR); Byeong Wook Yoo, Yongin (KR); Seong Taek Lee, Yongin (KR); Jae Ho Lee, Yongin (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/520,467

(22) Filed: Sep. 12, 2006

(65) Prior Publication Data

US 2007/0009826 A1 Jan. 11, 2007

(30) Foreign Application Priority Data

Nov. 7, 2005 (KR) ...................... 10-2005-0106167

(51) Int. Cl.
*G03F 7/34* (2006.01)
*G03F 7/16* (2006.01)
*G03F 7/11* (2006.01)

(52) U.S. Cl. .................... 430/271.1; 430/200; 430/935

(58) Field of Classification Search ................ 430/200, 430/271.1, 935
See application file for complete search history.

(56) References Cited

U.S. PATENT DOCUMENTS 5,998,085 A 12/1999 Isberg et al.
6,051,318 A 4/2000 Kwon (Continued)

FOREIGN PATENT DOCUMENTS

KR 2000-0034508 6/2000

OTHER PUBLICATIONS

Korean Patent Abstract for Korean Publication No. 1020000034508 A, published Jun. 26, 2000 in the name of Chun Geun Cho.

*Primary Examiner*—Richard L. Schilling
(74) *Attorney, Agent, or Firm*—Christie, Parker & Hale, LLP

(57) ABSTRACT

A manufacturing method using an additional heat-treatment process for a donor film with improved surface roughness. The improved donor film, used in a laser induced thermal imaging method, is capable of enhancing the lifetime of products and reducing the defect rates thereof. A manufacturing method for a donor film according to the invention, includes: providing a donor film comprising a base film, a light-to-heat conversion layer and an organic film; heating the donor film to provide a heat-treated donor film; and cooling the heat-treated donor film. The surface roughness of a donor film can be improved, and the non-uniform distribution of a laser on a region subjected to the LITI process can be minimized to prevent the over- or under-transfer of an transferred organic film, etc., and the non-uniform adhesion of the transferred organic film with an acceptor substrate.

13 Claims, 4 Drawing Sheets

U.S. PATENT DOCUMENTS 6,214,520 B1 4/2001 Wolk et al.
6,326,121 B1 * 12/2001 Takahashi .................. 430/200
2003/0157425 A1 * 8/2003 Kawase ...................... 430/200

* cited by examiner

MANUFACTURING METHOD FOR DONOR FILM WITH IMPROVED SURFACE ROUGHNESS

CROSS-REFERENCE TO RELATED APPLICATIONS

This application claims priority to and the benefit of Korean Patent Application No. 10-2005-0106167, filed in the Korean Intellectual Property Office on Nov. 7, 2005, the entire content of which is incorporated herein by reference.

BACKGROUND

The invention relates to a manufacturing method for a donor film with improved surface roughness. The manufacturing method, comprising an additional heat-treatment process, produces a donor film capable of enhancing the lifetime of an end product and reducing the defect rate thereof.

In general, an organic electroluminescence device, which is a flat panel display device, comprises an anode, a cathode and organic films interposed between the anode and the cathode. The organic films comprise at least a light-emitting layer and further comprise a hole injection layer, a hole transport layer, an electron transport layer, and an electron injection layer, in addition to the light-emitting layer. The organic electroluminescence devices may be classified as a polymer electroluminescence device or a low molecular electroluminescence device depending on the material composing the organic film, particularly the light-emitting layer.

In the organic electroluminescence device, the light-emitting layer should be patterned in order to implement a full coloring, wherein a method for patterning the light-emitting layer includes a method using a shadow mask for a low molecular electroluminescence device, and an ink-jet printing method or a laser induced thermal imaging (LITI) method for the polymer electroluminescence device. Among others, the LITI has the advantages of minutely patterning the organic film as well as performing a dry process instead of a wet process as in the ink-jet printing method.

In order to form the pattern of the polymer organic film using the LITI method, at least a light source, a substrate for an organic electroluminescence device, i.e., an acceptor substrate, and a donor film are required. The donor film comprises a base film, a light-to-heat conversion layer, and a transfer layer composed of an organic film. The patterning of the organic film on the acceptor substrate is performed while a laser from the light source is absorbed into the light-to-heat conversion layer and converted into heat energy. The organic film composing the transfer layer is transferred onto the acceptor substrate by the heat energy.

FIGS. 1A and 1B are cross sectional views showing a transfer mechanism in a general organic film transferring process according to the LITI method.

Referring to FIG. 1A, an organic film $S_2$ is adhered to a donor substrate $S_1$ comprising a base film $S_{1a}$ and a light-to-heat conversion layer $S_{1b}$ by a first adhesion $W_{12}$ between the donor substrate $S_1$ and the organic film $S_2$. The acceptor substrate $S_3$ is located on the lower part of the donor substrate $S_1$.

Referring to FIG. 1B, a laser having a specific wavelength irradiates a first region $R_1$ except for a second region $R_2$ on the base film $S_{1a}$. The laser passing through the base film $S_{1a}$ is converted into heat at the light-to-heat conversion layer and the heat causes the change for the first adhesion $W_{12}$ of the first region $R_1$ to transfer the organic film $S_2$ to the acceptor substrate $S_3$. In the transfer process by the laser, the factors significantly affecting the transfer characteristics of the organic film are the first adhesion $W_{12}$ between the donor substrate $S_1$ and the organic film $S_2$ in the second region $R_2$, cohesion $W_{22}$ within the organic film $S_2$, and a second adhesion $W_{23}$ between the organic film $S_2$ and $S_3$.

In performing the LITI process as described above, the characteristics of the donor film are factors significantly affecting the yield and quality of a product. Among others, the surface roughness of a donor film is one of the important factors since it affects the transfer uniformity.

As illustrated in FIG. 2, when a projection P and/or pore H is generated on the surface of the base film $S_{1a}$ or a barrier lamination is generated on the surface, the laser passing through the base film $S_{1a}$ may be non-uniformly distributed over an entire region on which the process is performed. Thus, scattering, distribution, local concentration and local dilution phenomena of the laser, etc., may occur.

The non-uniformity of the base film surface is inherently generated in the manufacturing process of the base film. Therefore, this non-uniformity can be generated in the base film as well as in any polymer products manufactured by the usual manufacturing processes.

With the non-uniform distribution as above, the transferred organic film can be over-transferred, under-transferred, etc., and the second adhesion between the organic film and the acceptor substrate can be non-uniform. This results in shortened product lifetimes, increased product defect rates, and diminished product quality.

SUMMARY OF THE INVENTION

In one embodiment of the invention, a manufacturing method provides a donor film with improved surface roughness. The improved donor film is capable of extending product lifetimes, reducing the defect rates of the products, and achieving high quality products by improving the surface roughness of a donor film and thus removing a non-uniform distribution of the laser in an LITI process on a region of the donor film.

In one embodiment, the manufacturing method for a donor film with improved surface roughness includes the steps of: providing a donor film comprising: a base film, a light-to-heat conversion layer, and an organic film; heating the donor film to create a heat-treated donor film; and cooling the heat-treated donor film.

In one embodiment, the heating step is performed at a temperature in the range of a glass transition temperature to a melting temperature of the base film. In another embodiment, the heating step is performed at a temperature in the range of a glass transition temperature of the base film to a deformation temperature or a reaction temperature of any one of the base film, the light-to-heat conversion layer and the organic film.

In one embodiment, prior to the heating step, the manufacturing method further comprises applying tension to the donor film.

In an embodiment, at least one of the heating and cooling steps is performed under vacuum, inert gas atmosphere, nitrogen atmosphere, and atmospheric pressure. In another embodiment, Ar is used as the inert gas.

In one embodiment, the base film may be made of polyethylene terephthalate (PET) material. In another embodiment, the heat-treating of the donor film with the base film comprising the PET material is performed at 90° C. or more. In yet another embodiment, the heat-treating is performed at 100° C.

BRIEF DESCRIPTION OF THE DRAWINGS

The various embodiments and advantages of the invention will become apparent and more readily appreciated from the following description of exemplary embodiments, taken in conjunction with the accompanying drawings of which.

DETAILED DESCRIPTION OF EXEMPLARY EMBODIMENTS

Figure 1A:
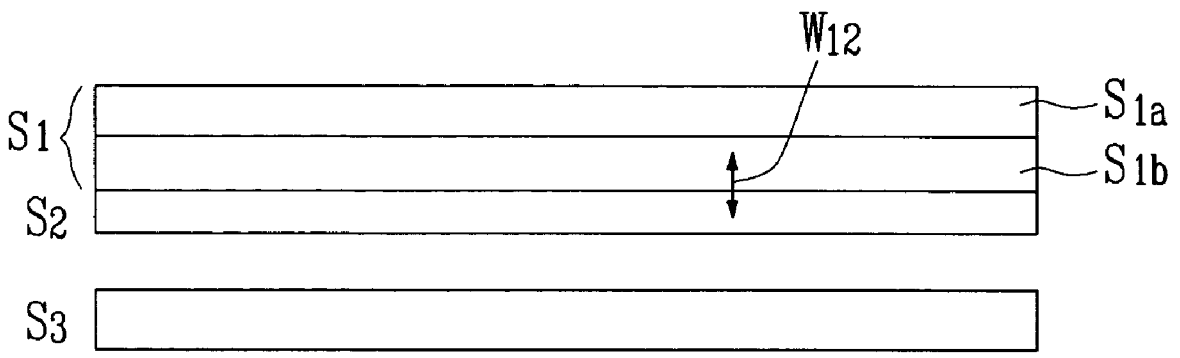
FIG. 1A (PRIOR ART)
FIGS. 1A and 1B are cross-sectional views for explaining a transfer mechanism in a general organic film transferring process according to the LITI method.
Figure 1B:
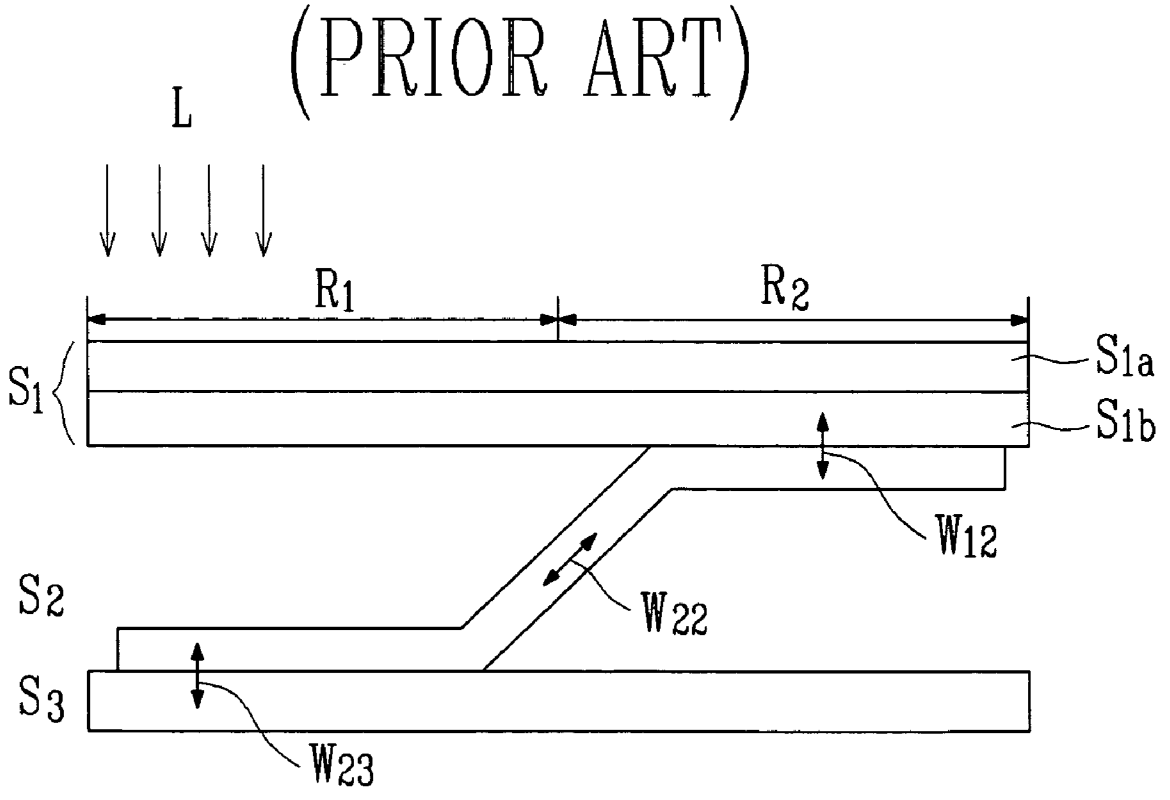
FIG. 1B (PRIOR ART)
Figure 2:
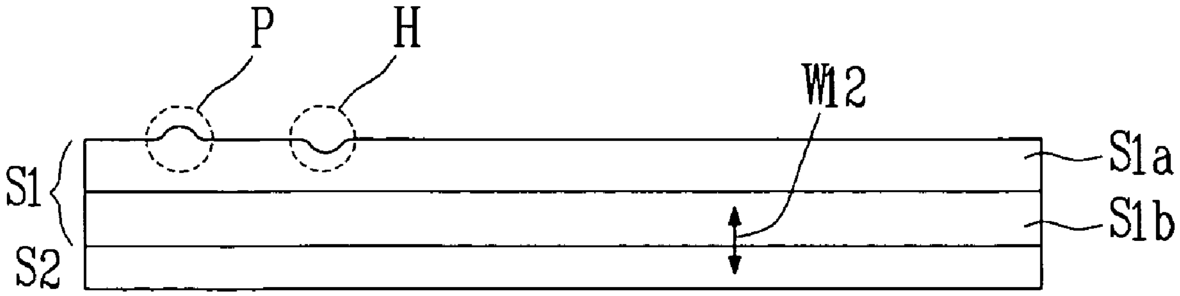
FIG. 2 is a schematic cross-sectional view illustrating a donor film wherein a projection P and a pore H are formed on a base film.

Hereinafter, exemplary embodiments of a manufacturing method for a donor film with improved surface roughness according to the invention will be described in more detail.

In one embodiment, a donor film comprising a base film, a light-to-heat conversion layer and an organic film is provided. Subsequently, the donor film is heat-treated and then cooled through an annealing process. The heat-treated donor film is transferred onto an acceptor substrate through a typical LITI process.

In one embodiment, the process for improving the surface roughness includes heat-treatment performed at a temperature in the range of a glass transition temperature to a melting temperature of a donor film, more accurately the base film which is the subject of the improvement of surface roughness.

In another embodiment, the heat-treatment is performed at a temperature in the range of the glass transition temperature of the base film to a deformation temperature or a reaction temperature of any one of the base film, the light-to-heat conversion layer and the organic film. This temperature range prevents the deformation of any one of the base film, the light-to-heat conversion layer, and the organic film which constitute the donor film, and prevents the reaction of an external system with any one thereof.

In one embodiment, the base film is composed of polymer materials such as polyethylene terephthalate (PET), which itself has flowability in the temperature range above its glass transition temperature, causing it to be rearranged by viscoelasticity. As a result, at temperatures greater than the glass transition temperature, the non-uniform surface generating factors, such as the projections and/or pores on the surface of the base film, are placed in a dynamically stabilized state, i.e., planarization.

In an embodiment, while performing the heat-treatment, tension is applied to the donor film. A phenomenon such as barrier lamination, which is relatively a larger non-uniform factor than the projections and/or pores, can be more easily solved by applying tension to the donor film as above.

In one embodiment, while performing the heat-treatment, the heating and/or cooling steps can be performed in a vacuum. This is because the activation degree of the surface of the base film is high at temperatures greater than the glass transition temperature, resulting in the ability to combine with other elements in the atmosphere or to cover the pores, to collect impurities, and the like.

In one embodiment, due to the reasons stated above, the heating and/or cooling steps can be performed in a nitrogen atmosphere or an inert gas atmosphere using Ar gas, etc. However, it can also be performed at atmospheric pressure in order to make the process run more easily and smoothly.

In one embodiment, the donor film whose surface roughness is improved through the heating step can be cooled through a typical cooling process, such as an air-cooling process, an air-blasting process, a cold air-blasting process, etc.

In the examples below, PET will be used as a base film that is manufactured according to various embodiments of the invention for improving the surface roughness of a donor film. The examples below are exemplary examples, and it is understood that they do not cover all possible variations, and that the invention is not limited thereto.

EXAMPLE 1

First, the donor film comprising a base film, a light-to-heat conversion layer, and a transfer layer composed of an organic film is prepared under atmospheric pressure. Next, the donor film is heated to 90° C. or more in the range of a glass transition temperature of the PET as the base film, wherein the heating temperature is maintained at or below the melting temperature in order to prevent the base film from melting. The heat-treatment of the base film can be visually observed, and the base film can be cooled when the desired surface roughness is achieved.

FIGS. 3A to 3D illustrate the state of the surface of a donor film before and after the process according to Example 1.

Figure 3A:
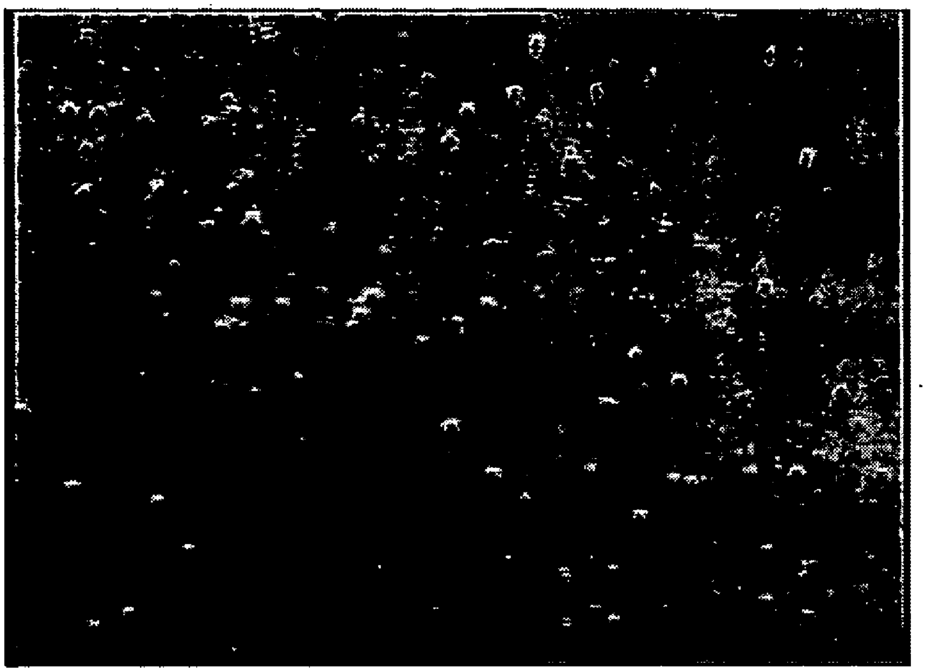
FIG. 3A is a photograph illustrating the non-uniform surface state of a donor film.
Figure 3B:
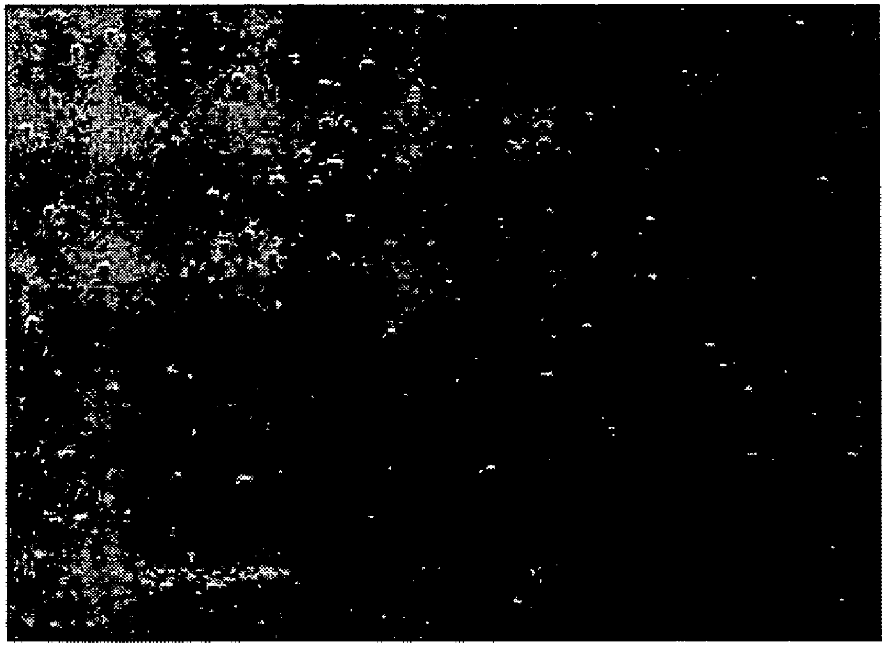
FIG. 3B is a photograph illustrating the surface state of a donor film after heat-treating it at 80° C. by a manufacturing method according to one embodiment of the invention.
Figure 3C:
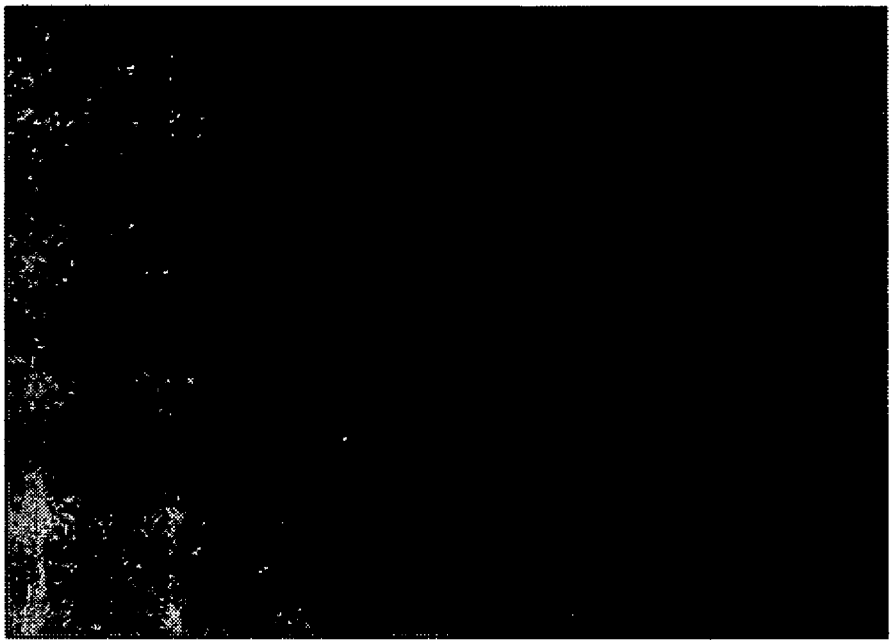
FIG. 3C is a photograph illustrating the state of the surface of a donor film in FIG. 3A after heat-treating it at 100° C. according to one embodiment of the invention.
Figure 3D:
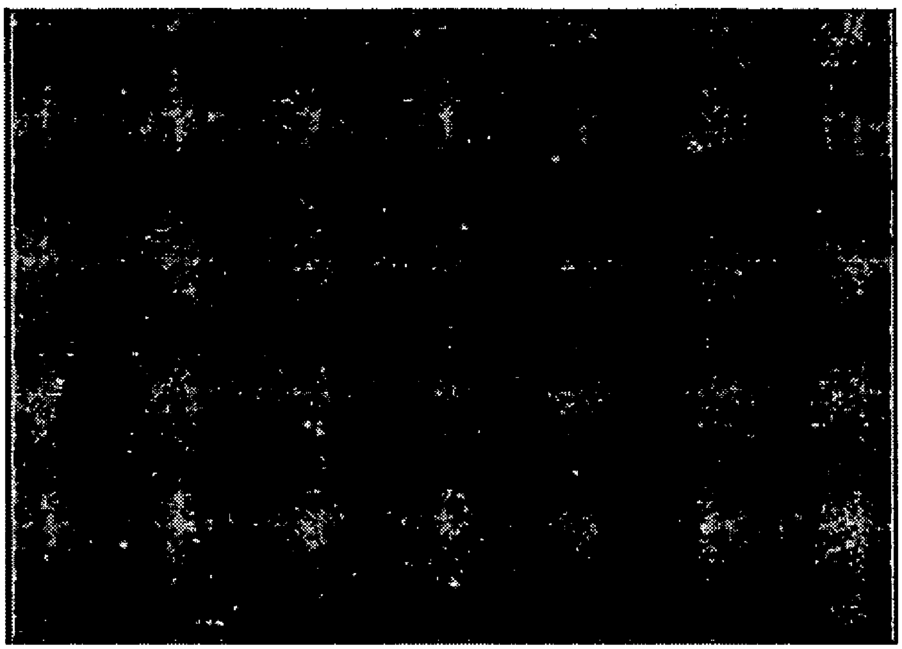
FIG. 3D is a photograph illustrating the state of the surface of a donor film in FIG. 3A after heat-treating it at 120° C. according to one embodiment of the invention.

FIG. 3A is a photograph illustrating the non-uniform state of the surface of a donor film. FIGS. 3B to 3D are photographs illustrating states of the surfaces of donor films after heat-treating them at 80° C., 100° C., 120° C., respectively, according to an embodiment of the invention similar to the method in Example 1.

Referring to FIGS. 3A to 3D, the surface of a donor film, comprising PET, before being manufactured according to an embodiment of the invention is extremely non-uniform. The surface state of a donor film heat-treated at 80° C. according to an embodiment of the invention can be observed as slightly improved. The surface of a donor film is very uniform when heat-treating it at 100° C. according to an embodiment of the invention. However, the surface roughness of a donor film may be observed as deteriorated by thermal deformation when heat-treating it at 120° C. according to an embodiment of the invention. It can be appreciated through the experimental results as above that an optimal heat-treating temperature according to one embodiment of the invention is 90° C. or more, preferably 100° C., when using PET material as the base film.

Hereinafter, other embodiments of a manufacturing method for a donor film with improved surface roughness according to the invention will be described where PET is used as a base film.

First, the base film comprising PET, before being manufactured into the donor film, is prepared. The base film may be in roll shape or other shape of a unit scale distributable in the market. It is impossible to apply tension to the base film in a unit scale shape such as a roll. Therefore, the base film itself is heat-treated without tension. The heat-treating temperatures, ranges, and methods are the same as described above in Example 1 and the embodiments at various temperatures above.

The manufacturing process using the base film from a unit scale, such as a roll, may be diminished in terms of manufacturing efficiency and surface roughness over the embodiments as described above; however, it may be advantageous in terms of mass production of products and cost.

According to the manufacturing method for a donor film with improved surface roughness as described in the embodiments above, the method can remove the non-uniform distribution of a laser on a region of the donor film subjected to the LITI process. The method improves the surface roughness of a donor film, thereby preventing the over-transfer and under-transfer of a transferred organic film, etc., and the non-uniform adhesion of the transferred organic film with an acceptor substrate. Thus, product lifetimes can be extended, defect rates of products are reduced, and high quality products are achieved.

Although a few exemplary embodiments of the invention have been shown and described, those skilled in the art will appreciate that changes may be made in these embodiments without departing from the principles and spirit of the invention, the scope of which is defined in the accompanying claims and their equivalents.

What is claimed is:

1. A manufacturing method for a donor film with improved surface roughness comprising:

providing a donor film comprising a base film, a light-to-heat conversion layer and an organic film;

heating the donor film to provide a heat-treated donor film; and cooling the heat-treated donor film.

2. The method according to claim 1, wherein the heating is performed at a temperature in the range of a glass transition temperature to a melting temperature of the base film.

3. The method according to claim 1, wherein the heating is performed at a temperature in the range of a glass transition temperature of the base film to a deformation temperature or a reaction temperature of any one of the base film, the light-to-heat conversion layer, and the organic film.

4. The method according to claim 1, further comprising applying tension to the donor film prior to the heating of the donor film.

5. The method according to claim 1, wherein at least one of the heating and cooling steps is performed under vacuum.

6. The method according to claim 1, wherein at least one of the heating and cooling steps is performed under an inert gas atmosphere.

7. The method according to claim 6, wherein the inert gas is Ar.

8. The method according to claim 1, wherein at least one of the heating and cooling steps is performed under a nitrogen atmosphere.

9. The method according to claim 1, wherein at least one of the heating and cooling steps is performed under atmospheric pressure.

10. The method according to claim 1, wherein the base film is made of polyethylene terephthalate (PET) material.

11. The method according to claim 10, wherein the heating of the donor film is performed at 90° C. or more.

12. The method according to claim 10, wherein the heating of the donor film is performed at 100° C.

13. A manufacturing method for a donor film with improved surface roughness comprising:

providing a donor film comprising a polyethylene terephthalate (PET) base film, a light-to-heat conversion layer and an organic film;

tensioning the donor film;

heating the donor film at 100° C. under a vacuum to provide a heat-treated donor film; and cooling the heat-treated donor film.

* * * * *